(12) United States Patent
Obu et al.

(10) Patent No.: US 7,487,581 B2
(45) Date of Patent: Feb. 10, 2009

(54) METHOD OF MANUFACTURING AN INVERTER DEVICE

(75) Inventors: Toshiharu Obu, Kanagawa-ken (JP); Nobumitsu Tada, Tokyo (JP); Hiroki Sekiya, Kanagawa-ken (JP); Keizo Hagiwara, Tokyo (JP); Shimpei Yoshioka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/723,826

(22) Filed: Mar. 22, 2007

(65) Prior Publication Data
US 2007/0165383 A1 Jul. 19, 2007

Related U.S. Application Data

(62) Division of application No. 10/813,444, filed on Mar. 21, 2004, now Pat. No. 7,206,205.

(30) Foreign Application Priority Data
Sep. 12, 2003 (JP) ............................. 2003-321462

(51) Int. Cl.
*H01F 7/06* (2006.01)
(52) U.S. Cl. .................. 29/602.1; 29/592.1; 29/740; 29/741; 29/759; 29/832; 219/68; 219/70; 361/704; 361/707; 361/717; 363/141; 363/144
(58) Field of Classification Search .................. 29/417, 29/592.1, 602.1, 740, 741, 742, 759, 831, 29/832; 219/68–70; 361/704, 707, 717; 363/141, 144
See application file for complete search history.

(56) References Cited

U.S. PATENT DOCUMENTS

| | | | |
|---|---|---|---|
| 4,458,305 | A | 7/1984 | Buckle et al. |
| 5,956,231 | A | 9/1999 | Yamada et al. |
| 6,414,867 | B2 | 7/2002 | Suzuki et al. |
| 6,661,659 | B2 | 12/2003 | Tamba et al. |
| 6,690,087 | B2 | 2/2004 | Kobayashi et al. |
| 6,768,193 | B2 | 7/2004 | Nakamura et al. |
| 6,987,670 | B2 * | 1/2006 | Ahmed et al. ............... 361/699 |
| 2004/0021149 | A1 * | 2/2004 | Kitazawa et al. ............ 257/108 |

FOREIGN PATENT DOCUMENTS

JP 2003-153554 A 5/2003

* cited by examiner

*Primary Examiner*—Paul D Kim
(74) *Attorney, Agent, or Firm*—Foley & Lardner LLP

(57) ABSTRACT

By providing a plurality of semiconductor chips that are connected in parallel and constitute one arm of an inverter; a first conductor to which a face on one side of said plurality of semiconductor chips is connected; a wide conductor to which a face on the other side of said plurality of semiconductor chips is connected; a second conductor said first conductor and second conductor are connected connected to said wide conductor; and a cooler to which through an insulating resin sheet, part of the heat loss generated in the semiconductor chips is thermally conducted to the first conductor and is thence thermally conducted to the cooler, producing cooling, while another part thereof is thermally conducted to the wide conductor and thence to the second conductor, whence it is thermally conducted to the cooler, producing cooling.

4 Claims, 9 Drawing Sheets

METHOD OF MANUFACTURING AN INVERTER DEVICE

CROSS-REFERENCE TO RELATED APPLICATION

The present application is a divisional of U.S. application Ser. No. 10/813,444, filed Mar. 31, 2004, the entire contents of which is incorporated herein by reference.

This application claims benefit of priority to Japanese Application No. JP 2003-321462 filed 12 Sep. 2003, the entire content of which is incorporated by reference herein.

BACKGROUND OF THE INVENTION

1. Field of the Invention

The present invention relates to an inverter device of high reliability which is of small size and excellent cooling efficiency, and a method of manufacturing the inverter device thereof and an electric automobile (sometimes called an electric vehicle or an electric car) incorporating the inverter device thereof.

2. Description of the Related Art

Miniaturization and improvement of reliability of power semiconductor elements and inverter devices employing these are being demanded. When semiconductor elements and inverter devices employing these are employed in an electric automobile, reduction in size and improved reliability are particularly important.

In order to achieve reduced size and improved reliability of power semiconductor elements and inverter devices employing these, power semiconductor elements and inverter devices are required that have excellent cooling efficiency such as Japanese Laid-Open patent 2003-153554.

The construction of a conventional inverter device is described below with reference to FIG. 1 and FIG. 2. FIG. 1 is a partial axial cross-sectional view showing the mounting structure of semiconductor chips in the interior of a power semiconductor element; FIG. 2 is a partial perspective view of a power semiconductor element.

In the inverter device shown in FIG. 2, a single arm of a three-phase inverter is constituted by connecting in parallel a plurality of IGBTs (insulated gate bipolar transistors) 171 and diodes 181 constituted by semiconductor chips of size no more than 10 mm square; furthermore, a plurality of semiconductor chips constituting a single arm of the three-phase inverter are bonded with a conductor 20 of thickness between 1.5 mm and 5 mm; the conductor 20 is adhesively fixed to a cooler 22 by a ceramics-containing insulating resin sheet 23. ("10 mm square" or "□10 mm" indicates that the length of one side of a square shape is 10 mm.)

Furthermore, in the inverter device shown in FIG. 2, four parallel-connected IGBTs 171A to 171D constituting an upper arm of the W phase of a three-phase inverter and two parallel-connected diodes 181A to 181B are arranged in a single row with an upper arm conductor 25 constituting an upper arm of the three-phase inverter; likewise, four parallel-connected IGBTs 172A to 172D constituting a lower arm of the W phase of a three-phase inverter and two parallel-connected diodes 182A to 182B are arranged in a single row with a lower arm conductor 26 constituting a lower arm of a three-phase inverter. In addition, a three-phase output conductor 27 that connects three-phase output terminal 32 with the IGBTs 171A to 171D and the diodes 181A to 181B is arranged on the upper arm conductor 25 between the upper arm conductor 25 and the lower arm conductor 26.

The construction of the upper arms and the lower arms will now be described. The arms are as follows in the case of an inverter device that converts DC current to three-phase AC current as shown in FIG. 3. Specifically, in order to generate three-phase AC power from DC battery power, an inverter is constituted comprising three-phase arms (U phase, X phase), (V phase, Y phase) and (W phase, Z phase) and conversion to AC current is effected therein. This AC current provides three-phase AC power for driving a three-phase motor.

The upper arms are constituted by the U phase, V phase and W phase and the lower arms are constituted by the X phase, Y phase and Z phase.

In FIG. 2, the lower arm conductor 26 and the three-phase output conductor 27 are constituted by the same conductor. In addition, a negative electrode conductor 28 that connects the negative electrode terminal 31 with the IGBTs 172A to 172D and the diodes 182A to 182B arranged on the lower arm conductor 26 is arranged between the upper arm conductor 25 and the lower arm conductor 26. Electrical connection is effected by means of wire bonding 29 between the respective conductors and the IGBTs and diodes.

In the inverter device shown in FIG. 1 to FIG. 2 the IGBTs 171A to 171D and the diodes 181A to 181C bonded with the conductor 20 and/or upper arm conductor 25 and lower arm conductor 26 are directly connected with a cooler 22 using insulating resin sheet 23, so the thermal resistance of the IGBTs and diode chips within the interior of the power semiconductor element is reduced. Furthermore, since the IGBTs 171A to 171D and diodes 181A to 181C are bonded with the conductor 20 and/or upper arm conductor 25 and lower arm conductor 26 of thickness between 1.5 mm and 5 mm, the thermal time constant becomes large, due to the effect of the thermal capacity of the conductor 20 and/or upper arm conductor 25 and lower arm conductor 26, with the result that transient thermal resistance become small and the rise in temperature during start-up of the inverter becomes small. Cooling efficiency is therefore improved and miniaturization of the inverter device can be achieved.

However, with the conventional inverter device, although the thermal resistance of the IGBTs and the diode chips in the interior of the power semiconductor elements was reduced, there were the following problems.

First of all, manufacturing time was prolonged since considerable time was required to provide the plurality of wire bonding locations involved in the electrical wiring of the plurality of parallel-connected IGBTs or diode chips by wire bonding.

Also, there were structural limits to the extent to which the cooling efficiency could be improved.

Accordingly, one object of the present invention is to provide a novel inverter device and method of manufacturing the device thereof and an electric automobile incorporating this inverter device wherein power semiconductor elements, that provide excellent manufacturing characteristics, are employed, in order to improve current capacity and reduce the size of the inverter device, but wherein the cooling efficiency of the power semiconductor elements is further improved.

SUMMARY OF THE INVENTION

In order to achieve the above object, an inverter device according to the present invention is constructed as follows. Specifically, an inverter device according to the present invention comprises: a plurality of parallel-connected semiconductor chips constituting an arm of an inverter;

a first conductor to which one face of this plurality of semiconductor chips is connected;

a wide conductor to which the other face of this plurality of semiconductor chips is connected;

a second conductor connected to the wide conductor; and a cooler to which said first conductor and second conductor are adhesively fixed, with an insulating resin sheet interposed therebetween.

According to the present invention, the current capacity of the inverter device can be improved and reduction in size and improved reliability also achieved.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
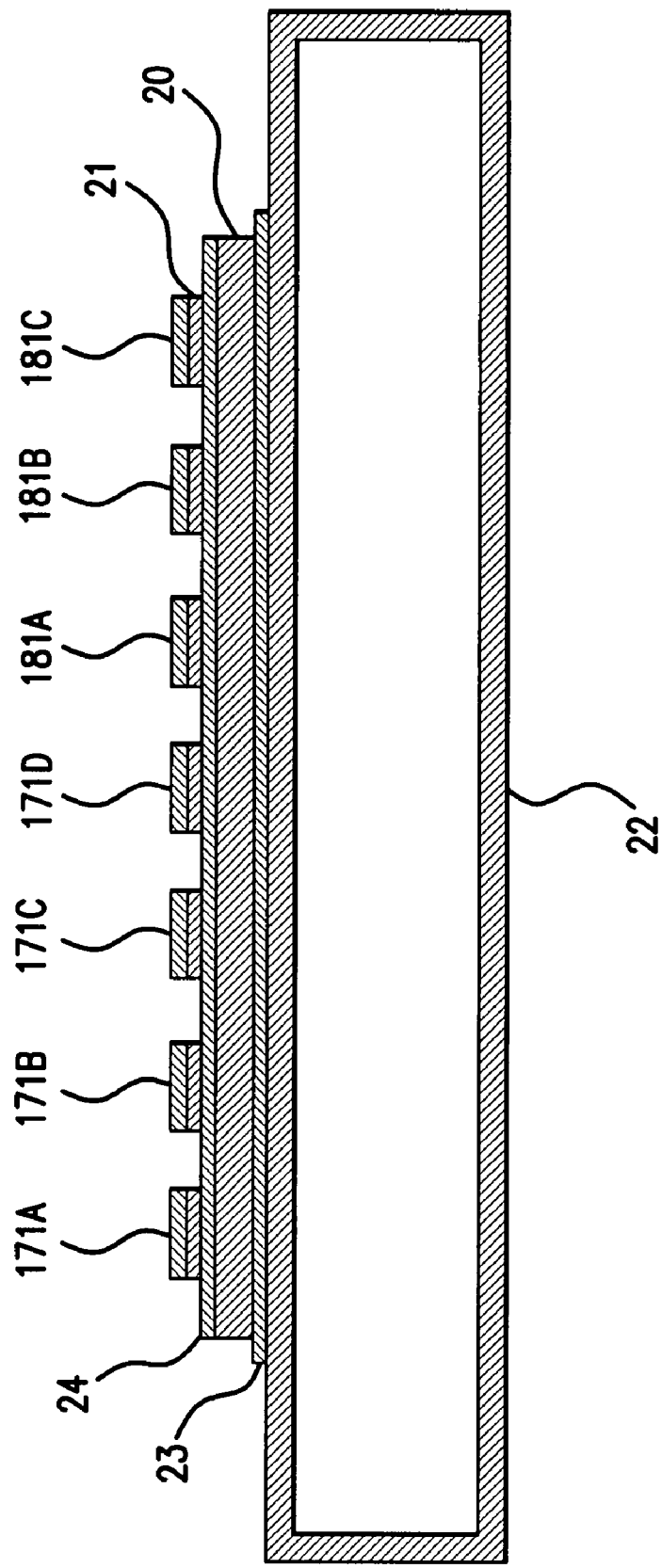
FIG. 1 is a partial vertical cross-sectional view showing the mounting structure of semiconductor chips within the interior of a conventional power semiconductor element.

Referring now to the drawings, wherein like reference numerals designate identical or corresponding parts throughout the several views, and more particularly to FIG. 4 thereof, one embodiment of the present invention will be described.

Figure 4:
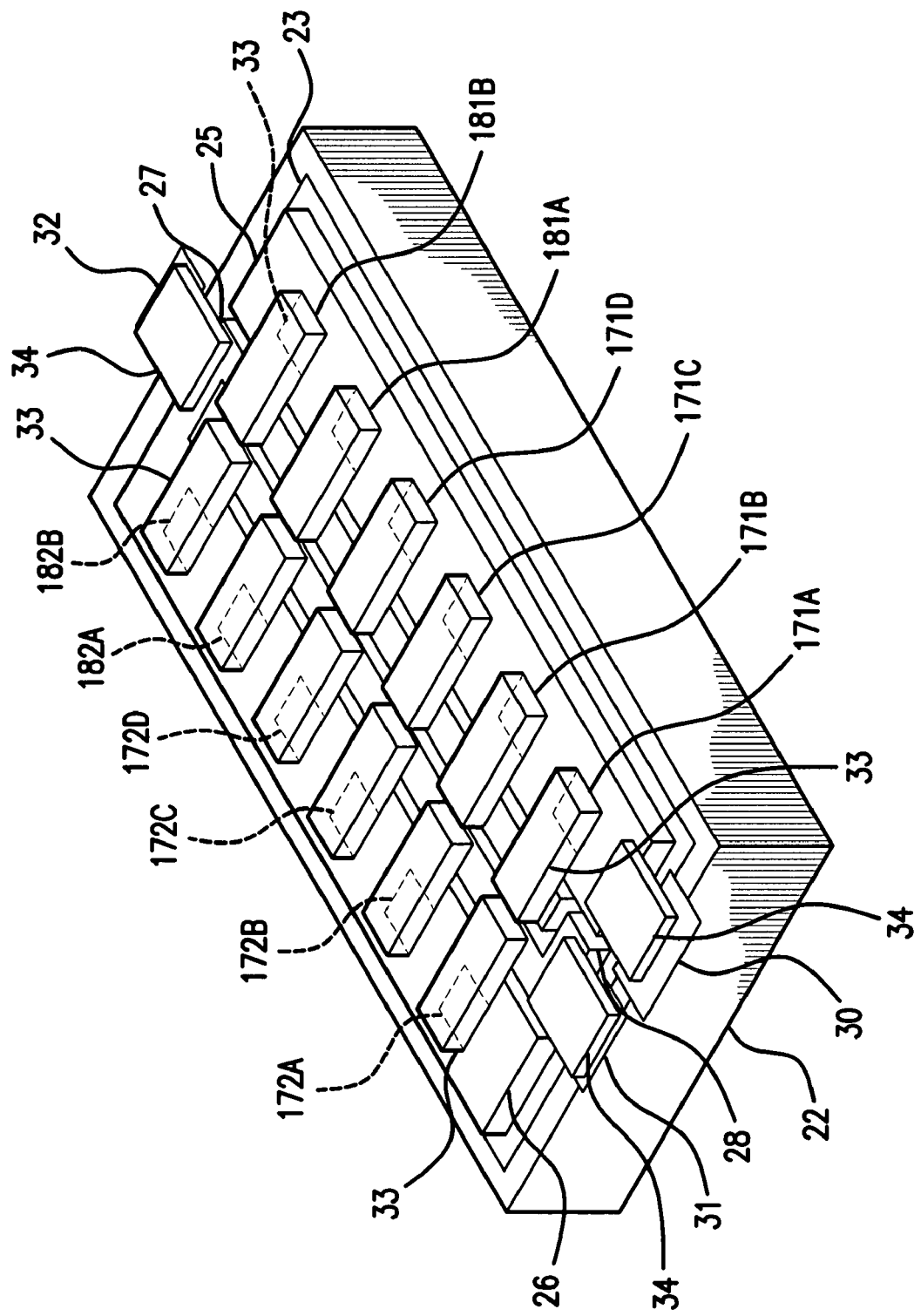
FIG. 4 is a partial perspective view showing the mounting structure of an inverter device according to a first embodiment of the present invention.
Figure 5:
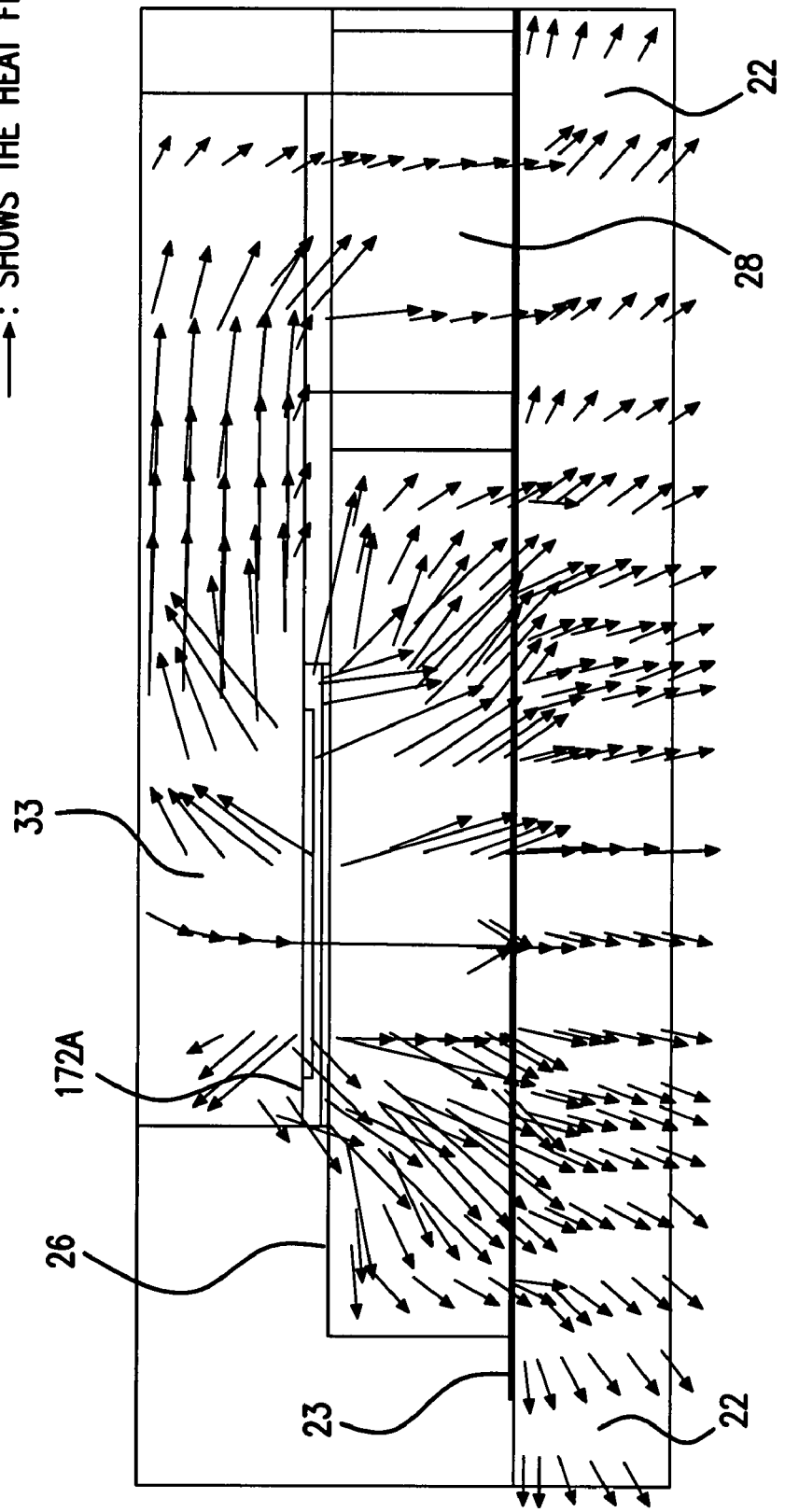
FIG. 5 is a view showing the results of analysis of heat flux showing the heat discharge paths of loss of heat generated by a semiconductor chip during passage of current by the inverter device of FIG. 4.
Figure 6:
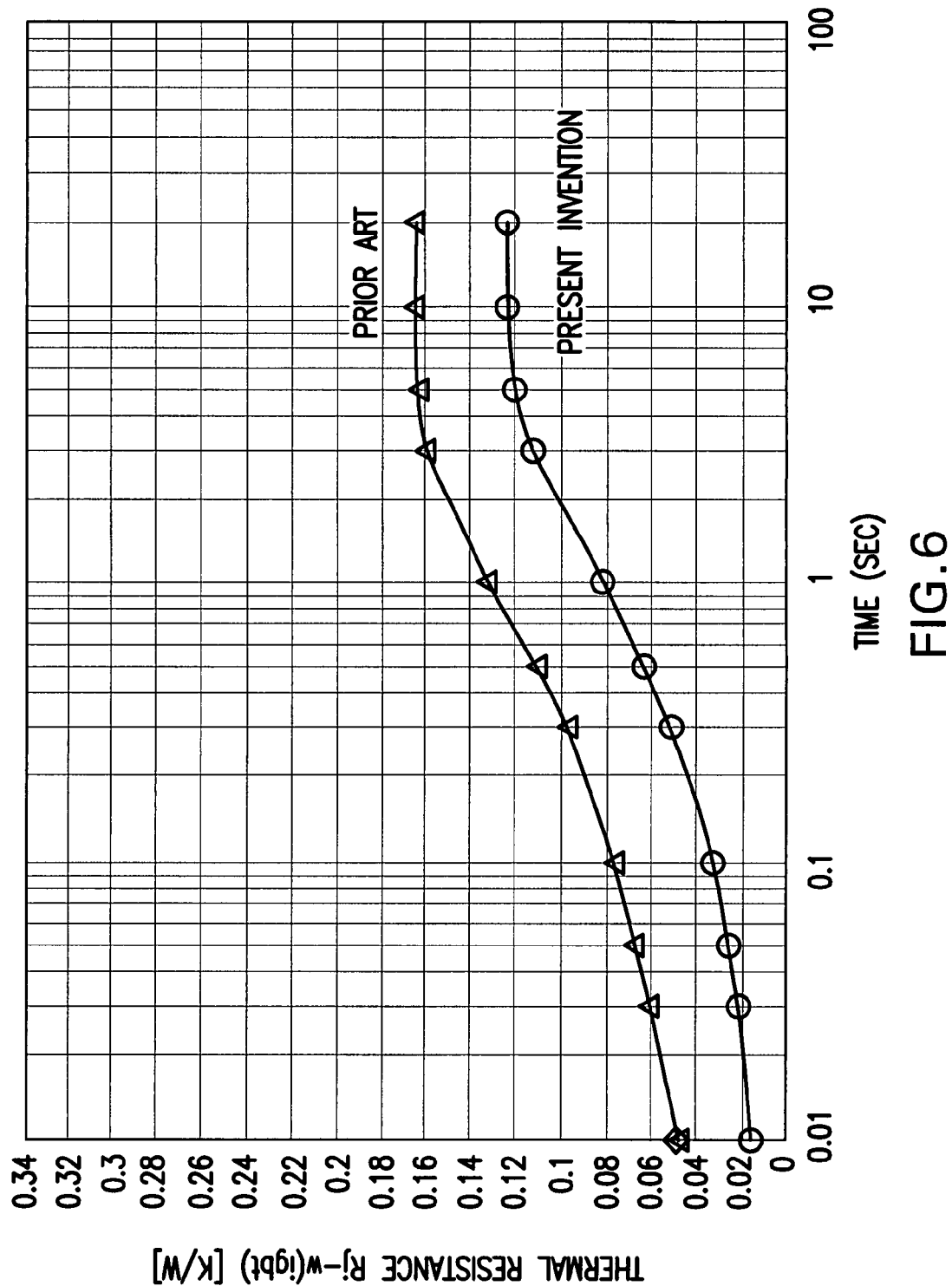
FIG. 6 is a view showing the results of analysis of transient thermal resistance of a semiconductor chip of the inverter device of FIG. 4.

FIG. 4 is a partial perspective view showing the mounting structure of an inverter device according to a first embodiment of the present invention. FIG. 5 is a view showing the results of analysis of heat flux showing the heat discharge paths of loss of heat generated by a semiconductor chip during passage of current by the inverter device of FIG. 4. FIG. 6 is a view showing the results of analysis of transient thermal resistance of a semiconductor chip of the inverter device of FIG. 4.

In the inverter device of FIG. 4, one arm of the three-phase inverter is a constituted by connecting in parallel IGBTs 171A to D and diodes 181A to B and IGBTs 172A to D and diodes 182A to B, which are semiconductor chips of size less than 10 mm square ("10 mm square" indicates that the length of one side of a square shape is 10 mm.). FIG. 4 shows the case where four IGBTs are connected in parallel and two diodes are connected in parallel.

Furthermore, four parallel-connected IGBTs 171A to 171D constituting an upper arm of a three-phase inverter and two parallel-connected diodes 181A to 181B are arranged in a single row with an upper arm conductor 25 constituting an upper arm of a three-phase inverter; likewise, four parallel-connected IGBTs 172A to 172D constituting a lower arm of the three-phase inverter and two parallel-connected diodes 182A to 182B are arranged in a single row with a lower arm conductor 26 constituting a lower arm of the three-phase inverter.

In addition, three-phase output conductors 27 that connect three-phase output terminals 32 with the IGBTs 171A to 171D and the diodes 181A to 181B are arranged on the upper arm conductor 25 between the upper arm conductor 25 and the lower arm conductor 26. In the embodiment of FIG. 4, the lower arm conductor 26 and the three-phase output conductor 27 are constituted by the same conductor.

In addition, a negative electrode conductor 28 that connects the negative electrode terminal 31 with the IGBTs 172A to 172D and the diodes 182A to 182B arranged on the lower arm conductor 26 is arranged between the upper arm conductor 25 and the lower arm conductor 26.

The thickness of the upper arm conductor 25 and lower arm conductor 26 and three-phase output conductor 27 and negative electrode conductor 28 is about 1.5 mm to 5 mm. The IGBTs and the diodes are arranged dispersed by distances of at least twice the thickness of the aforesaid conductors and are bonded with the conductors by low melting point solder such as Sn/Pb or high melting point solder such as Sn/Ag/Cu. The inventors of the present invention believe that the latter i.e. high melting point solder will often be used in future in view of environmental engineering aspects.

In addition, the upper arm conductor 25 and lower arm conductor 26 and three-phase output conductor 27 and negative electrode conductor 28 are adhesively fixed to the cooler 22 by means of a ceramics-containing insulating resin sheet 23. The insulating resin sheet 23 is filled with ceramic filler such as for example boron nitride in the insulating resin and has a thermal conductivity of 2 to 4 W/mK and a thickness of about 0.05 to 0.15 mm.

In addition, a wide conductor 33 is bonded with the upper parts of the IGBTs and diodes by means of low melting point solder such as Sn/Pb or high melting point solder such as Sn/Ag/Cu, so that these are electrically connected by means of the three-phase output conductor 27 and negative electrode conductor 28 and wide conductor 33.

The upper arm conductor 25 and positive electrode terminal 30, and the three-phase output conductor 27 and three-phase output terminal 32, and the negative electrode conductor 28 and negative electrode terminal 31 are electrically connected by means of an input/output conductor 34.

Since the material of the IGBTs 171 and IGBTs 172 and of the diodes 181 and diodes 182 is silicon (Si), while the material of the various conductors is copper (Cu), the linear expansion coefficient of the IGBTs and diodes and the conductors differ. As a result, when loaded by the temperature cycle, shearing stress is generated in the solder bonding the IGBTs and diodes with the conductors, resulting in the production of non-linear strain. If the value of the non-linear strain becomes large, cracking etc is generated in the solder when loaded by the temperature cycle. Reduction of the value of the non-linear strain improves reliability and durability.

Consequently, when the chip size of the IGBTs and diodes is large, non-linear strain of the solder is increased. It is therefore necessary to keep the chip size below about 10 mm square in order to ensure reliability and durability of the inverter device.

However, if the chip size is less than 10 mm square, the current capacity per chip is small, so in order to construct an inverter device of a few tens of kW for use in an electric automobile, chips must be connected in parallel.

Also, in order to reduce the rise in temperature in particular on start-up of the inverter and in order to reduce the steady thermal resistance by the heat dispersion effect of the conductors, the thickness of the upper arm conductor 25 and lower arm conductor 26 and three-phase output conductor 27 and negative electrode conductor 28 is preferably 1.5 to 5 mm.

A three-phase RST AC power source is only produced by providing three such inverters (elements) having three-phase output terminals 32.

FIG. 5 shows the results of analysis of heat flux in a steady condition, showing the flow of heat loss when cooling is effected by thermal conduction of heat loss generated in an IGBT 172A constituted by a semiconductor chip to the cooler 22 during passage of current by the inverter device. The arrows show the direction of the heat flux and the magnitude of the arrows shows the magnitude of the heat flux.

Figure 2:
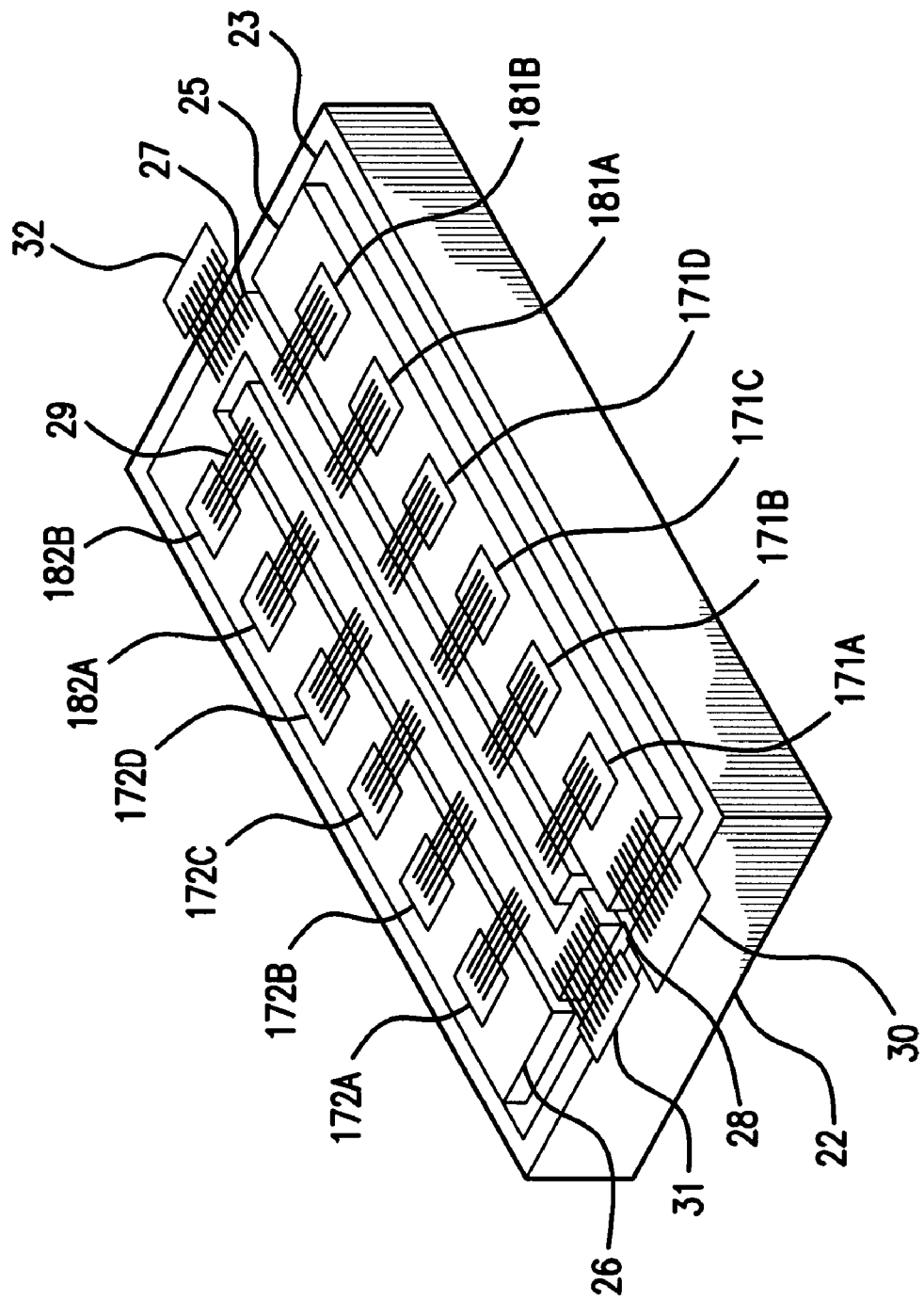
FIG. 2 is a partial perspective view of a conventional power semiconductor element.
Figure 3:
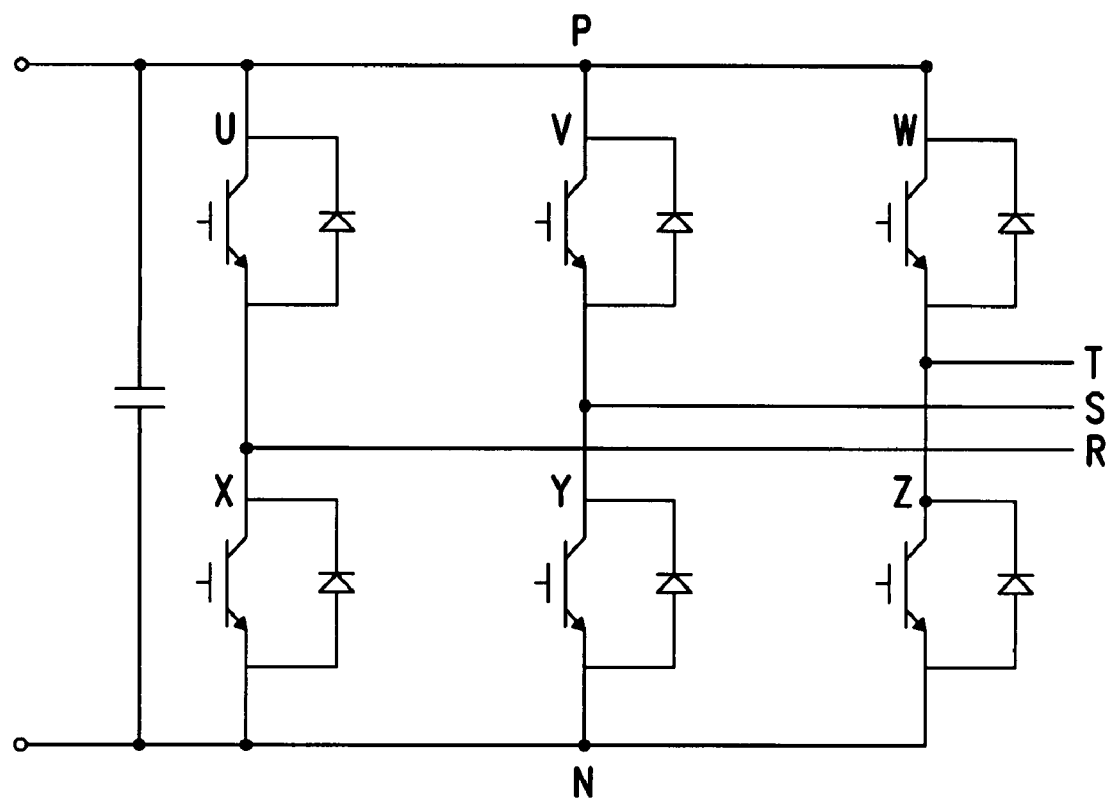
FIG. 3 is a view given in explanation of the construction of an arm.

FIG. 6 shows the results of analysis comparing the transient thermal resistance of the prior art power semiconductor element shown in FIG. 1 and FIG. 2 and a semiconductor chip of a power semiconductor element according to the present invention.

In the prior art power semiconductor element, the wire bonding is extremely fine, so the thermal resistance is extremely large. Consequently, as shown in FIG. 5, practically all of the heat loss generated in the IGBT 172A is thermally conducted to the lower arm conductor 26 and emitted to the cooler 22.

In contrast, as shown in FIG. 5, in the case of a power semiconductor element according to the present invention, part of the heat loss generated in the IGBT 172A is thermally conducted to the wide conductor 33 and thence thermally conducted to the negative electrode conductor 28, while another part thereof is thermally conducted to the lower arm conductor 26 and is thence conducted to the cooler 22, thereby achieving cooling.

In this analysis, it is assumed that the thickness of the wide conductor 33 is 3 mm, and the thickness of the lower conductor 26 and negative electrode conductor 28 is 3 mm. In order to promote thermal conduction from the wide conductor 33, since large cross-sectional area implies small thermal resistance, preferably the wide conductor should have some degree of thickness (of the order of a few mm). Although the thermal resistance can be reduced by making the cross-sectional area large, the problem of increased weight is generated.

As described above, according to the present invention, both faces of the IGBT 172A are cooled, by means of the wide conductor 33 and the lower arm conductor 26, so, as shown in FIG. 6, the steady thermal resistance after 10 to 20 sec is lowered by about 25% compared with that of a conventional power semiconductor element. The transient thermal resistance for 0.1 to 0.3 sec on start-up of the inverter, which used to present a problem, is also reduced by about 50% compared with that of the prior art power semiconductor element, due to cooling of both sides of the wide conductor 33 and the thermal capacity effect.

Also, if, in a power semiconductor element according to the present invention, the electrical wiring is completed by bonding the IGBTs and diodes and conductors and wide conductor using solder, the steps of wiring a plurality of wire bonding locations, as in the prior art power semiconductor element, become unnecessary, reducing the manufacturing time.

In this way, in an inverter device according to the first embodiment, the thermal resistance of the IGBTs and diode chips in the interior of the power semiconductor element is further reduced, both on inverter start-up and in the steady condition, thereby lowering the rise in temperature of the IGBTs and diode chips and improving cooling efficiency. In this way, improvement in reliability and size reduction of the inverter device can be achieved and the manufacturing yield (manufacture yield) of the power semiconductor element can also be improved.

Next, a second embodiment of the present invention will be described.

Figure 7:
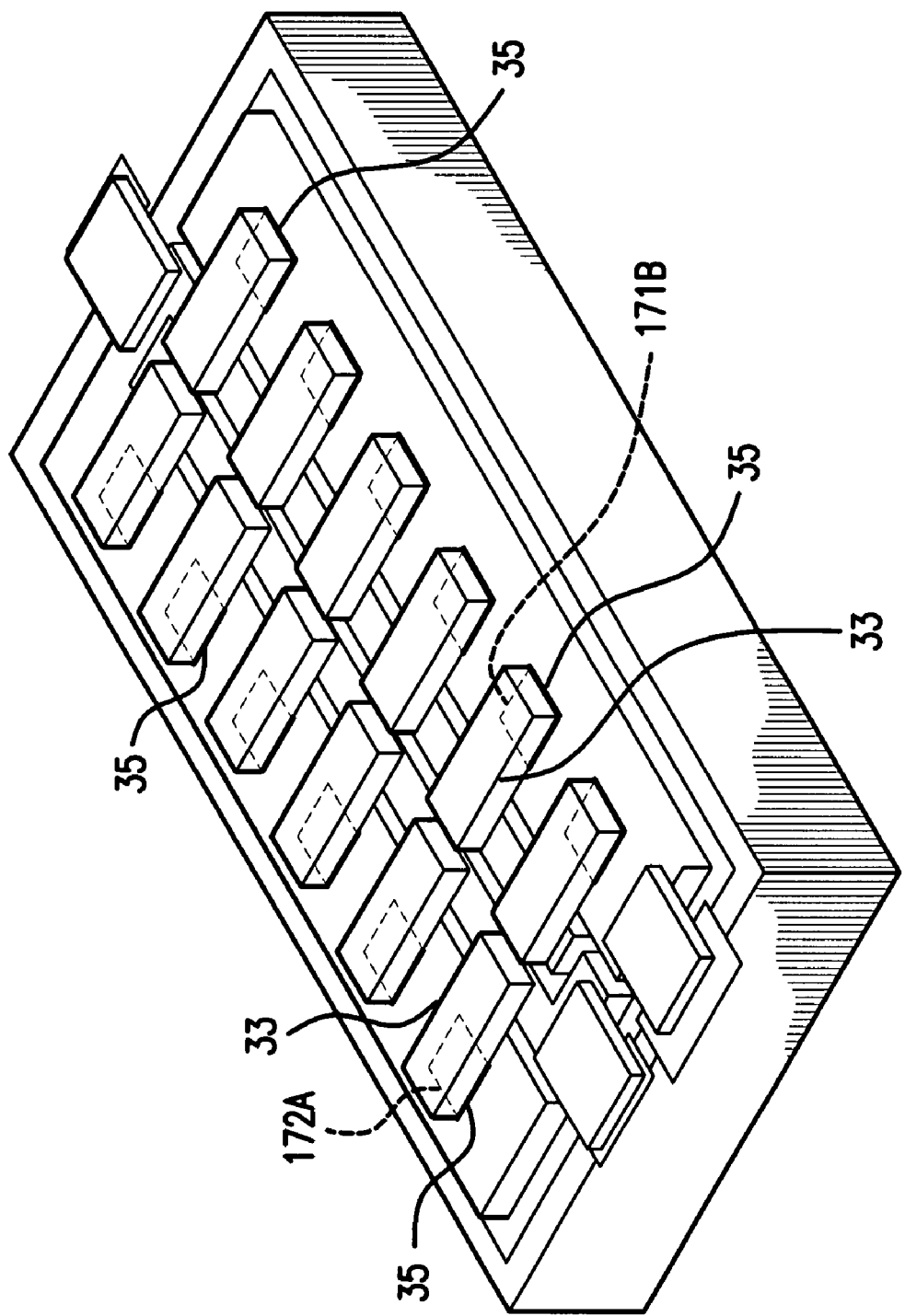
FIG. 7 is a partial perspective view showing the mounting structure of an inverter device according to a second embodiment of the present invention.
Figure 8A:
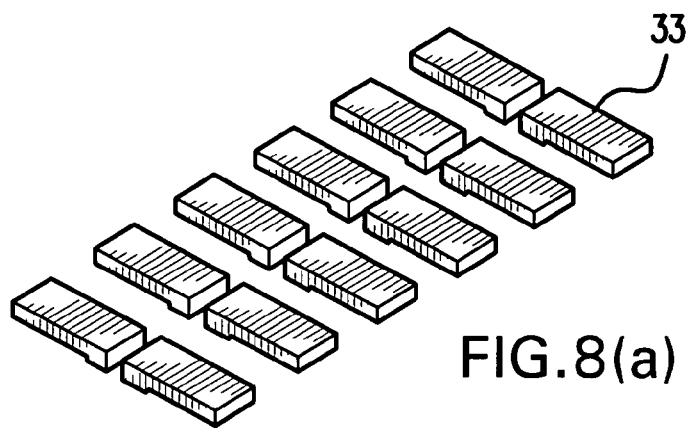
FIG. 8A, FIG. 8B and FIG. 8C are respectively partial perspective views showing the sequence of manufacturing an inverter device according to the second embodiment of the present invention.
Figure 8B:
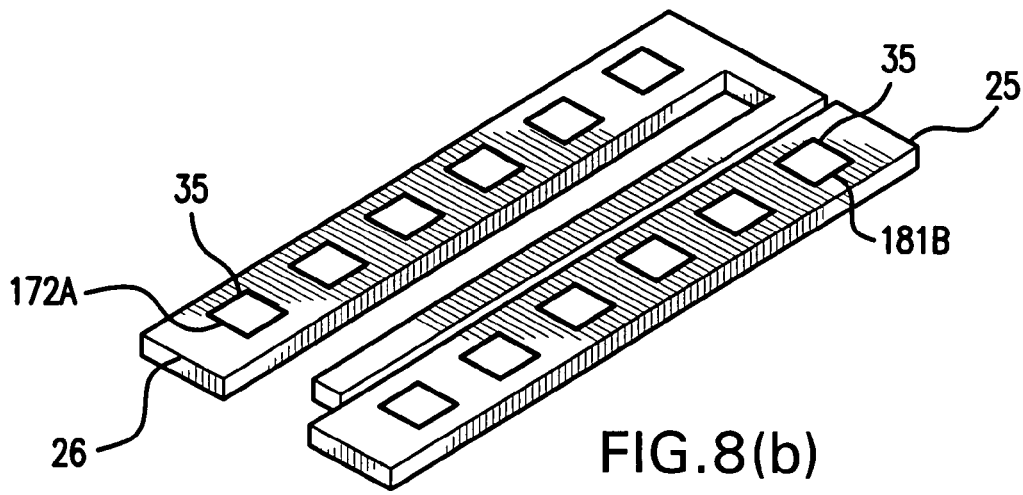
Figure 8C:
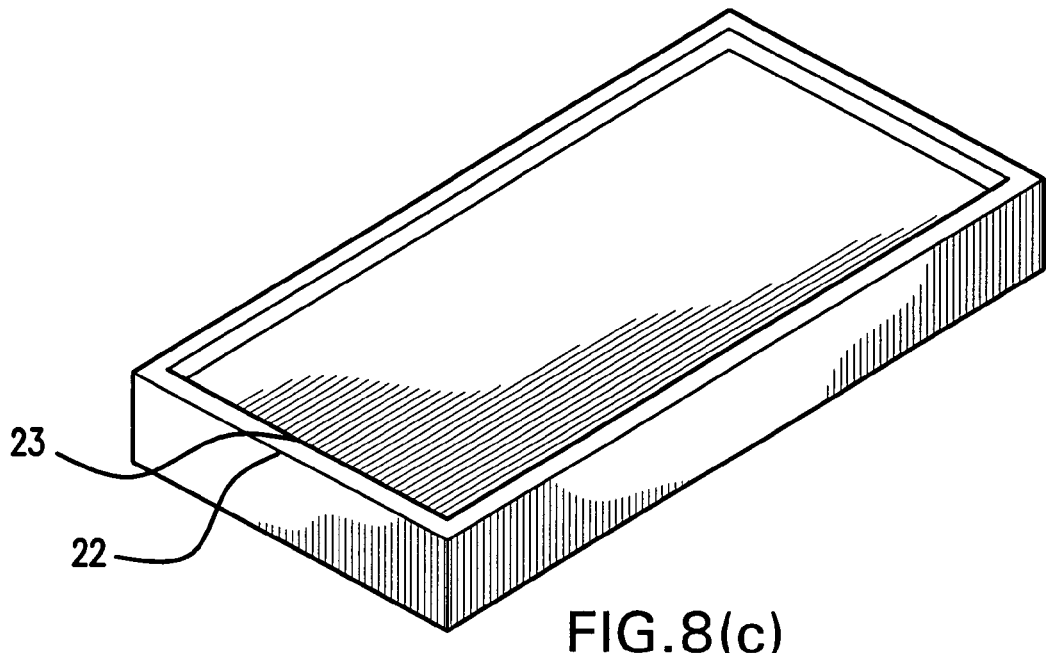

FIG. 7 is a partial perspective view showing the mounting structure of an inverter device according to a second embodiment of the present invention. FIG. 8A, FIG. 8B and FIG. 8C are partial perspective views showing the manufacturing sequence of an inverter device according to the second embodiment of the present invention.

In FIG. 7, heat buffer plates 35 are bonded by low melting point solder such as Sn/Pb or high melting point solder such as Sn/Ag/Cu with the upper parts of the semiconductor chips constituting IGBTs 171A to D and diodes 181A to B and IGBTs 172A to D and diodes 182A to B of the power semiconductor element and the wide conductor 33 is adhesively fixed by electrically conductive adhesive to the top of the heat buffer plates 35.

The material of the heat buffer plates 35 is for example molybdenum (Mo) or the like, which has a linear expansion coefficient close to that of the semiconductor chips and its thickness is about 0.5 mm. The electrically conductive adhesive has a heat conductivity of about 15 to 60 W/mK and is for example an adhesive whose matrix consists of insulating resin but which is filled with a conductive substance such as silver filler. Other details concerning the construction are the same as in the first embodiment.

In the above construction, heat buffer plates 35 and conductive adhesive are interposed between the semiconductor chips and the wide conductor 33, but, if for example the heat buffer plates 35 are made of molybdenum, with a thickness of 0.5 mm and the thermal conductivity of the electrically conductive adhesive is 15 W/mK, albeit the thermal resistance is about 5% greater than that of the first embodiment, the steady resistance after 10 to 20 sec is reduced by about 20% compared with the prior art power semiconductor element.

Furthermore, as shown in FIG. 8B, first of all, the IGBTs 171A to D and diodes 181A to B and IGBTs 172A to D and diodes 182A to B and heat buffer plates 35 and the aforesaid conductors of the power semiconductor element according to the present invention are bonded by low melting point or high melting point solder.

After this, adhesive fixing by heating of the conductors and the cooler 22 using insulating resin sheet 23 and, in addition, adhesive fixing by heating of the heat buffer plates 35 and the wide conductor 33 is effected using electrically conductive adhesive, in respective steps at the same temperature.

Furthermore, since the wide conductor 33 is divided for each semiconductor chip, adhesive fixing using pressure and heat is effected using insulating resin sheet 23 by applying pressure to the conductors and cooler 22 at the locations where a plurality of semiconductor chips are not bonded on each conductor.

With a power semiconductor element manufactured as described above, adhesive fixing with the cooler 22 by pressure and heating can be achieved using the insulating resin sheet 23 in steps at the same temperature with the respective conductors in an independent condition, but in a condition in which the conductors are not integrated with the wide conductors 33 by solder bonding, as they are in the first embodiment, even when variations occur in the degree of planarity or warping of the adhesive fixing surfaces of the conductors with respect to the cooler, in the case of upper arm conductors 25 and lower arm conductors 26 and the three-phase output conductors 27 and negative electrode conductors 28 wherein the output capacity of the inverter is large, increasing the number of semiconductor chips arranged in parallel and increasing the length of the conductors. Adhesive fixing can therefore be achieved in a condition in which the cooler 22 and the conductors are totally integrated.

Thus, in this second embodiment, even if the output capacity of the inverter device is increased, the manufacturing yield of the power semiconductor elements can be improved and, both during inverter start-up and in the steady condition, the temperature rise of the IGBTs and diode chips is low, being practically equivalent to that of the first embodiment, and the cooling effect is improved.

Figure 9:
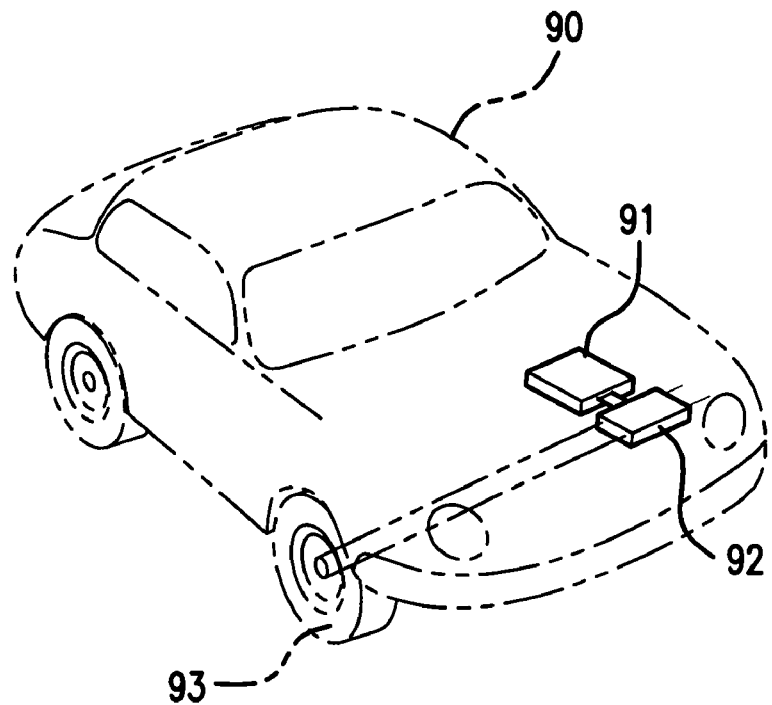
FIG. 9 is a simplified transparent perspective view of the case where an inverter device according to the present invention is incorporated in an electric automobile.

FIG. 9 is a diagrammatic transparent perspective view showing the case in which an inverter device as described above is incorporated in an electric automobile. The inverter device 91 as described above is incorporated in the interior of the front part of the vehicle body 90 of the electric automobile, and a three-phase electric motor 92 that is supplied with power by this inverter device is provided in the vehicle body 90. Drive wheels 93 are driven by this three-phase electric motor 92, supplying propulsive force to the electric automobile.

Figure 10:
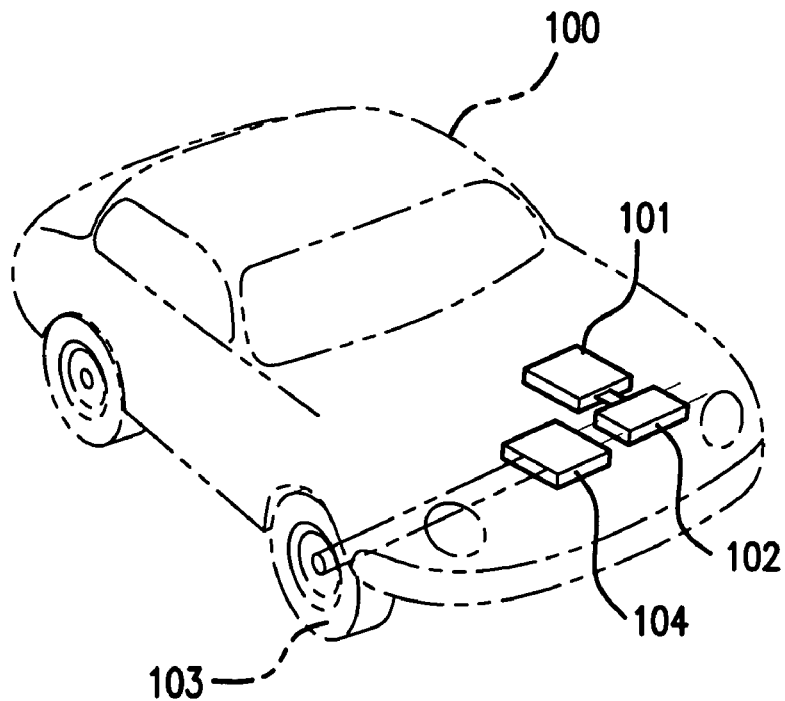
FIG. 10 is a simplified transparent perspective view of the case where an inverter device according to the present invention is incorporated in an electric automobile that also incorporates an internal combustion engine.

FIG. 10 is a diagrammatic transparent perspective view showing the case in which an inverter device as described above is incorporated in an electric automobile. The inverter device 101 as described above is incorporated in the interior of the front part of the vehicle body 100 of the electric automobile, and a three-phase electric motor 102 that is supplied with power by this inverter device is provided in the vehicle body 100. Drive wheels 103 are driven by this three-phase electric motor 102, supplying propulsive force to the electric automobile.

This vehicle body 100 also incorporates an internal combustion engine 104 and the drive wheels 103 are also driven by this internal combustion engine 104. Such an electric automobile is termed a so-called hybrid vehicle, in which the drive wheels 103 are driven as required by the three-phase electric motor 102 and/or the internal combustion engine 104.

Although the above description was in respect of an inverter device employed in an electric automobile, the present invention is not restricted to this and could of course be applied to other applications. The present invention can usefully be applied in particular to elevators or electric trains.

Furthermore according to the above description IGBT is used as a semiconductor chip, however, other semiconductor chips such as MOSFET (Metal Oxide Semiconductor Field Effect Transistor) and the like may be used with the same result. Not only Si but also SiC with a wide gap semiconductor as material of the semiconductor chip may be used with the same result.

What is claimed is:

1. A method of manufacturing an inverter device that includes a plurality of heat buffer plates, comprising:
    bonding a plurality of semiconductor chips and said heat buffer plates by a low melting point or high melting point solder;
    bonding said heat buffer plates and a conductor by a low melting point or high melting point solder;
    dividing a wide conductor into a plurality of chips fixing said conductor to a cooler;
    fixing said heat buffer plates with said plurality of chips;
    fixing said conductor and said cooler by application of pressure at locations where the plurality of semiconductor chips are not bonded to said conductor;
    forming said conductor as an upper arm conductor and a lower arm conductor; and
    bonding a first subset of said heat buffer plates onto said upper arm conductor and bonding a second subset of said heat buffer plates onto said lower arm conductor.

2. The method of manufacturing an inverter device according to claim 1, wherein said fixing of said conductor to said cooler comprises adhesively fixing said conductor to said cooler by means of a ceramics-containing insulating resin sheet.

3. The method of manufacturing an inverter device according to claim 1, wherein the bonding of the plurality of semiconductor chips and the heat buffer plates comprises bonding a top surface of the plurality of semiconductor chips to the heat buffer plates.

4. The method of manufacturing an inverter device according to claim 1, wherein said forming step further comprises:
    forming said lower conductor arm to have a first extension part and a second extension part extending in a longitudinal direction substantially parallel with respect to each other and separated from each other by a gap,
    wherein a first subset of said plurality of chips are bonded to said second subset of heat buffer plates and are disposed on said lower conductor arm so as to span the gap, and
    wherein a second subset of said plurality of chips are bonded to said first subset of heat buffer plates.

* * * * *